US012787716B2

(12) United States Patent
Hashimoto et al.

(10) Patent No.: US 12,787,716 B2
(45) Date of Patent: Nov. 3, 2026

(54) METHOD OF MANUFACTURING SEMICONDUCTOR DEVICE BY FORMING ALUMINUM ALLOY FILM AND REMOVING POSSIBLE DEFECTS IN SEMICONDUCTOR CHIPS

(71) Applicant: FUJI ELECTRIC CO., LTD., Kawasaki (JP)

(72) Inventors: Tatsuya Hashimoto, Azumino-city (JP); Kazuhiro Kitahara, Matsumoto-city (JP); Noriaki Noji, Nagano-city (JP); Ryota Kataoka, Matsumoto-city (JP); Naoko Kodama, Matsumoto-city (JP); Shunya Hayashida, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 368 days.

(21) Appl. No.: 18/398,561

(22) Filed: Dec. 28, 2023

(65) Prior Publication Data

US 2024/0290663 A1 Aug. 29, 2024

(30) Foreign Application Priority Data

Feb. 24, 2023 (JP) ................................ 2023-027026

(51) Int. Cl.
*H10P 74/20* (2026.01)
*H10D 12/01* (2025.01)
(Continued)

(52) U.S. Cl.
CPC ......... *H10P 74/203* (2026.01); *H10D 12/038* (2025.01); *H10D 64/01* (2025.01); *H10P 54/00* (2026.01)

(58) Field of Classification Search
CPC ........ H10P 74/203; H10P 74/00; H10P 76/00; H10P 50/00; H10D 12/038; H10D 64/01;
(Continued)

(56) References Cited

U.S. PATENT DOCUMENTS

2003/0168968 A1* 9/2003 Sotani .................... H10D 86/00 313/503
2006/0181198 A1* 8/2006 Gotoh ................ H10D 30/6737 257/E29.147

(Continued)

FOREIGN PATENT DOCUMENTS

JP 2005-347313 A 12/2005
JP 2022-143566 A 10/2022

*Primary Examiner* — William B Partridge
*Assistant Examiner* — David Paul Sedorook
(74) *Attorney, Agent, or Firm* — Rabin & Berdo. P.C.

(57) ABSTRACT

A method of manufacturing a semiconductor device, including: forming a surface structure including a metal oxide semiconductor structure in a semiconductor substrate; forming an interlayer insulating film covering the surface structure; forming, in the interlayer insulating film, a contact hole to expose the surface structure; forming a first Al alloy film in contact with the surface structure and covering an entire surface of the interlayer insulating film, the first Al alloy film having a thickness of 0.05 µm to 0.5 µm; detecting, using a dark field, a defect of a surface of the first Al alloy film; forming a second Al alloy film covering the entire surface of the first Al alloy film; patterning the first and second Al alloy films; annealing the first and second Al alloy films; and dicing the semiconductor substrate into a plurality of chips, and picking, among the plurality of chips, chips free of the detected defect.

5 Claims, 6 Drawing Sheets

(51) Int. Cl.
*H10D 64/01* (2025.01)
*H10P 54/00* (2026.01)

(58) Field of Classification Search
CPC ... H01L 22/12; H01L 21/78; H01L 29/66348; H01L 29/401
See application file for complete search history.

(56) References Cited

U.S. PATENT DOCUMENTS

| | | | | |
|---|---|---|---|---|
| 2008/0001186 | A1* | 1/2008 | Shastri | H01F 17/0006 257/277 |
| 2011/0309456 | A1* | 12/2011 | Yamazaki | H10D 30/6739 257/411 |
| 2019/0172912 | A1* | 6/2019 | Hirose | H10D 30/60 |
| 2021/0025846 | A1* | 1/2021 | Cao | G01N 27/4145 |
| 2021/0391437 | A1* | 12/2021 | Ohse | H10D 30/668 |
| 2022/0099593 | A1* | 3/2022 | Sweetnam | G01N 21/9501 |
| 2022/0301948 | A1 | 9/2022 | Shoji et al. | |
| 2023/0064636 | A1* | 3/2023 | Takahashi | H10P 54/00 |

* cited by examiner

METHOD OF MANUFACTURING SEMICONDUCTOR DEVICE BY FORMING ALUMINUM ALLOY FILM AND REMOVING POSSIBLE DEFECTS IN SEMICONDUCTOR CHIPS

CROSS REFERENCE TO RELATED APPLICATIONS

This application is based upon and claims the benefit of priority of the prior Japanese Patent Application No. 2023-027026, filed on Feb. 24, 2023, the entire contents of which are incorporated herein by reference.

BACKGROUND OF THE INVENTION

1. Field of the Invention

Embodiments of the invention relate to a method of manufacturing a semiconductor device.

2. Description of the Related Art

A method of manufacturing a semiconductor device in which an Al alloy film constituting an Al electrode is deposited by a sputtering process separated into two stages to suppress destruction of an electrode portion is conventionally known (for example, refer to Japanese Laid-Open Patent Publication No. 2005-347313). Further, a method of manufacturing a semiconductor device including a determination process in which voltage corresponding to a thickness of a gate insulating film is applied to the gate insulating film, a threshold voltage of a semiconductor device is measured, and whether the semiconductor device conforms is determined (for example, refer to Japanese Laid-Open Patent Publication No. 2022-143566).

SUMMARY OF THE INVENTION

According to an embodiment, a method of manufacturing a semiconductor device includes: providing a semiconductor substrate; forming a surface structure including a metal oxide semiconductor (MOS) structure in the semiconductor substrate; forming an interlayer insulating film covering the surface structure; forming, in the interlayer insulating film, a contact hole to expose the surface structure; forming a first Al alloy film in contact with the surface structure and covering an entire surface of the interlayer insulating film, the first Al alloy film having a thickness in a range of 0.05 μm to 0.5 μm; detecting, using a dark field, a defect of a surface of the first Al alloy film; forming a second Al alloy film covering the entire surface of the first Al alloy film; patterning the first Al alloy film and the second Al alloy film; annealing the first Al alloy film and the second Al alloy film; and dicing the semiconductor substrate into a plurality of chips, and picking, among the plurality of chips, chips free of the detected defect.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
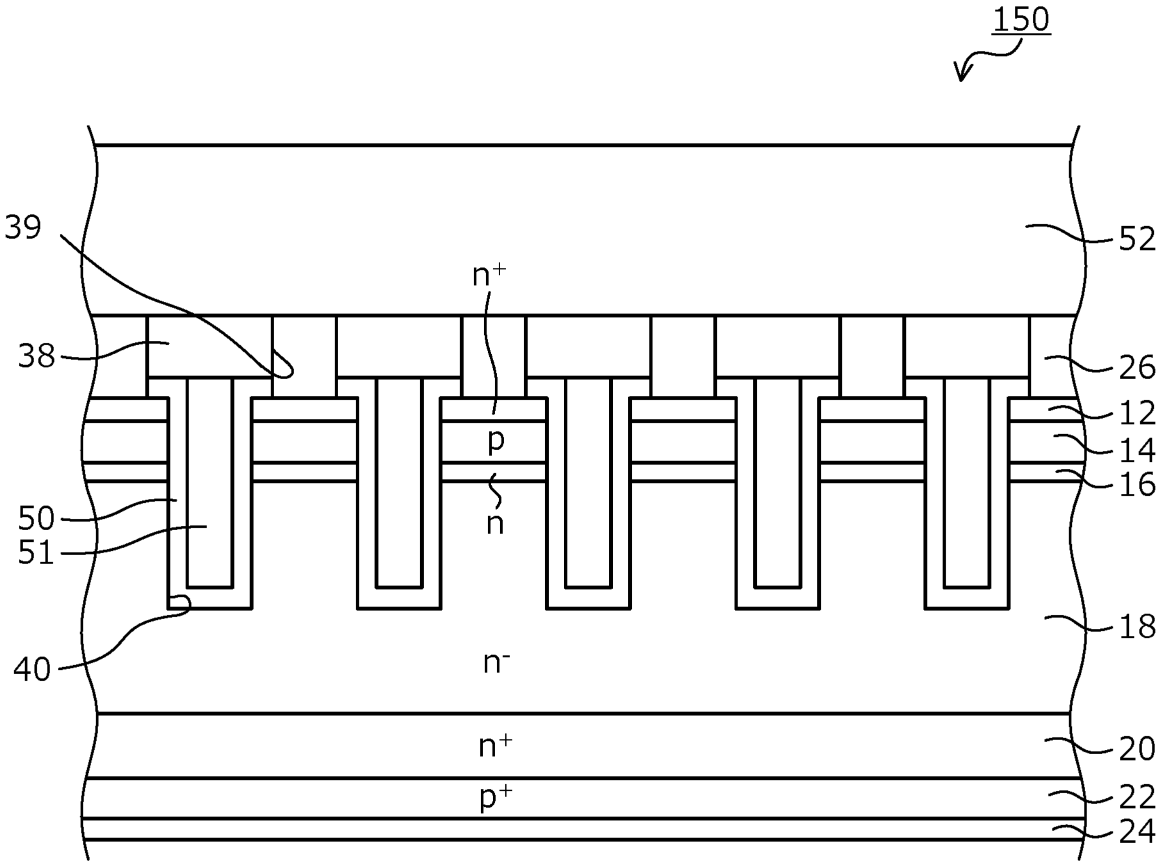
FIG. 1 is a cross-sectional view depicting a structure of a semiconductor device according to an embodiment.

First, problems associated with the conventional techniques are discussed. In the conventional methods of manufacturing a semiconductor device, a problem arises in that during wafer processing, whether a semiconductor device conforms cannot be determined, whereby materials are wasted making semi-finished products.

Embodiments of a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and are not repeatedly described. Further, with consideration of variation in manufacturing, description indicating the same or equal may be within 5%.

Figure 7:
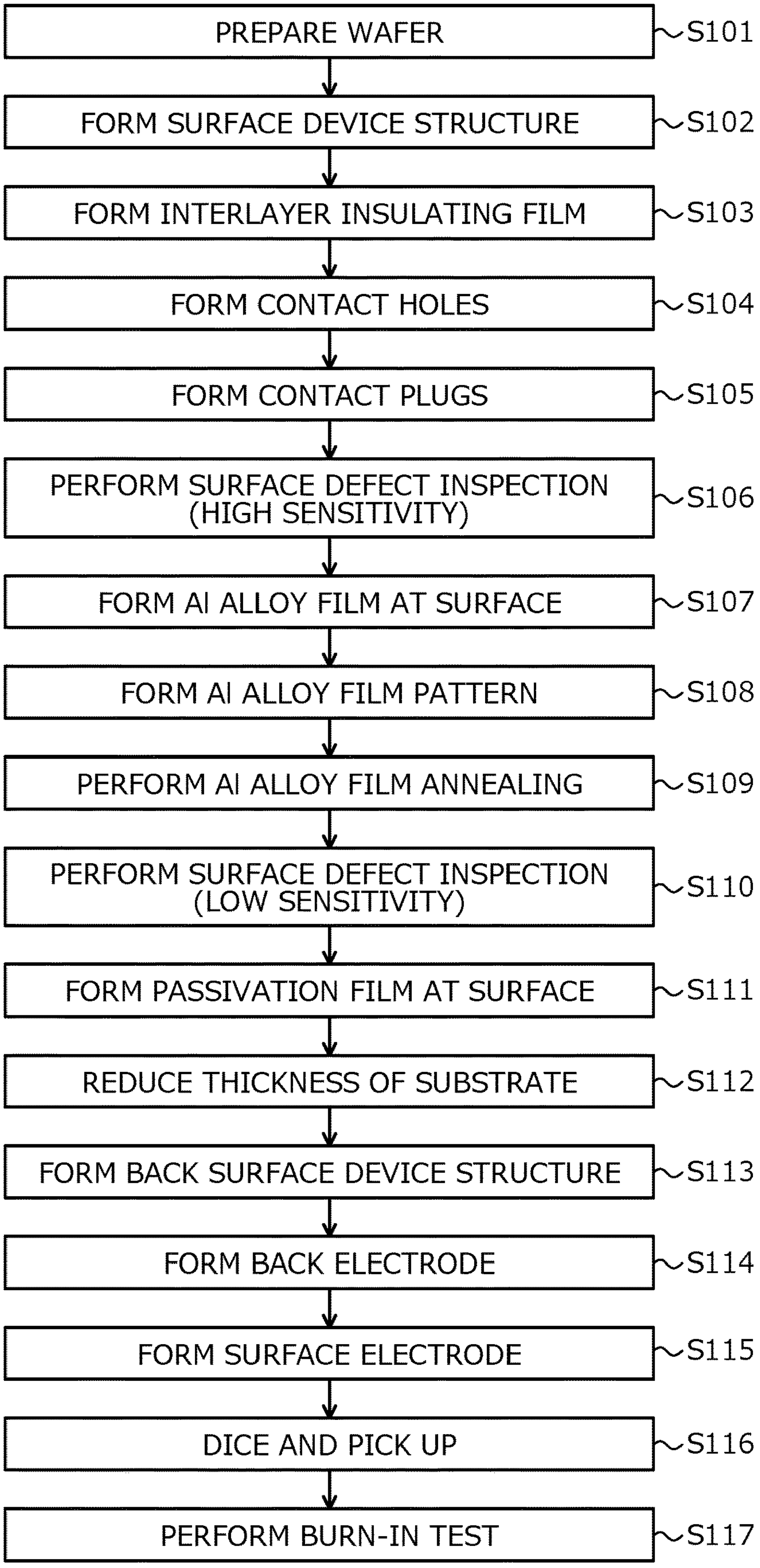
FIG.7 RELATED ART
FIG. 7 is a flowchart depicting a conventional method of manufacturing the conventional semiconductor device.

First, a conventional method of manufacturing a semiconductor device is described. FIG. 7 is a flowchart depicting the conventional method of manufacturing a semiconductor device. The conventional method of manufacturing a semiconductor device is described taking an insulated gate bipolar transistor (IGBT) with a focus on formation of a surface electrode (in an instance of an IGBT, an emitter electrode).

First, an $n^-$-type semiconductor substrate (wafer) having a normally employed thickness is prepared (step S101). Next, by a general method, a surface device structure such as a metal oxide semiconductor (MOS) gate (metal-oxide film-semiconductor insulated gate) is formed (step S102). Next, an interlayer insulating film such as, for example, a BPSG film is deposited (formed) so as to cover gate electrodes (step S103).

Next, the interlayer insulating film is patterned, thereby forming contact holes (step S104). Next, contact plugs are formed in the contact holes, respectively (step S105). Next, a highly sensitive defect inspection of the surface is performed (step S106). Here, the defect inspection with a high sensitivity capable of detecting defects having a size of 0.5 μm or larger is performed. As a result, surface defects occurring in the processes from the formation of the interlayer insulating film to the formation of the contact plugs are detected. The defects occurring in these processes have a potential of becoming killer defects during formation of an Al alloy film, such as an aluminum silicon (AlSi) alloy film in a subsequent process and the sensitivity of defect detection after formation of the Al alloy film decreases, therefore, defect inspection is performed before the formation of the Al alloy film. Next, for example, by a sputtering method, the Al alloy film, which covers an entire area of the surface of the interlayer insulating film, is formed so as to be in contact with the contact plugs in the contact holes (step S107). For example, an AlSi film having a thickness of about 5 μm is formed, as an emitter electrode, using a film formation temperature of 400 degrees C. or higher.

Next, the Al alloy film is patterned (step S108). Next, the Al alloy film is annealed and the emitter electrode is formed (step S109). Next, a surface defect inspection of a low sensitivity is performed (step S110). As a result, defects occurring at the surface in the processes from the formation of the Al alloy film to the patterning are inspected. At the surface of the Al alloy film, crystal grains of a particle size in a range of about 0.5 μm to 20 μm are present. Due to these crystal grains, in terms of scattering, for defects having a size of about 0.5 μm in a lateral direction, scattering due to the defects cannot be distinguished from scattering due to grain boundaries of crystal grains and the defect inspection here is performed with a low sensitivity incapable of detecting defects of a size of 0.5 μm or greater.

Next, on the emitter electrode, a passivation film is formed by, for example, a polyimide film (step S111). Next, the thickness of the $n^-$-type semiconductor substrate is decreased by grinding the $n^-$-type semiconductor substrate from the back surface thereof to a predetermined position corresponding to a product thickness used for the semiconductor device (step S112). Next, at the grinded back surface of the $n^-$-type semiconductor substrate, a back surface device structure is formed (step S113). For example, an $n^+$-type FS layer, a $p^+$-type collector region, etc. are formed.

Next, at the back surface of the $n^-$-type semiconductor substrate, a back electrode that is in contact with the $p^+$-type collector region is formed (step S114). Next, at a surface of the semiconductor wafer, Ni—P plating is formed on the emitter electrode (on the Al alloy film formed at steps S108, S109) and Au plating is formed on the Ni—P plating, thereby, forming a surface electrode (step S115). Next, the $n^-$-type semiconductor substrate is cut (diced) into individual chips and chips in which no defects were detected at steps S106, S110 are picked up (step S116). Next, a burnin (burn-in) test is performed, and screening is performed (step S117).

As described, in the conventional method of manufacturing a semiconductor device, the surface defect inspection is performed twice, once before the formation of the Al alloy film and once after the formation of the Al alloy film. In the inspection before the formation of the Al alloy film, defects occurring any time after the inspection until the patterning of the Al alloy film cannot be detected and the defect inspection after the formation of the Al alloy film has a low sensitivity. Thus, in the conventional method of manufacturing a semiconductor device, defects of a size of 0.5 μm or greater occurring any time after the inspection performed before the formation of the Al alloy film until the patterning of the Al alloy film cannot be detected.

Here, among power device chips such as IGBTs and freewheeling diodes (FWDs) are products in which a film is formed at the surface electrode by electroless plating. The base substrate of the electroless plating is a surface of an aluminum (Al) film or an Al alloy film such as an AlSi film. Therefore, when a large protruding defect occurs during formation of the Al alloy film, the resist at the time of patterning may not sufficiently cover the Al alloy film, whereby defects of the Al alloy film may occur during etching and voids may result.

During electroless plating, a semiconductor wafer is immersed in a plating solution. When the surface on which the plating film is deposited is a normal surface (the base substrate Al alloy film), cleaning and etching of the surface, followed by displacement of zinc (Zn) results in the formation of a Ni plating film, a Ni—P plating film, etc.

Nonetheless, in an instance in which voids and/or defects of the base-substrate Al alloy film are present and the film is porous, $Na^+$ ions may penetrate the substrate when the semiconductor wafer is immersed in the plating solution. When $Na^+$ ions penetrate the substrate, the ions that have penetrated into the substrate may move to the gate over a long period of time and cause Vth anomalies (I-V curve anomalies).

Conventionally, before shipping, to detect conditions with the potential of failing once out in the market, a burn-in test is employed. In the burn-in test, at a semi-finished product stage, the diffusion of mobile ions is promoted by an application of heat and I-V curve anomalies are detected by the pre-shipment test. By the burn-in test, while defects may be detected due to shifting of the I-V curve, 100% detection of minute amounts of $Na^+$-ion penetration is not certain.

Further, in the burn-in test of a semi-finished product, when a defect is detected, the processes performed up to the detection (processes after dicing, up to the semi-finished product) and the materials used for the semi-finished product are wasted. As described, the burn-in test of a semi-finished product is a test after completion of wafer processing and thus, an upstream measure is demanded. Defect inspection during wafer processing is one response to this demand. This inspection is a method of implementing a defect inspection during wafer processing as described above, detecting chips potentially having a defect during a process, detecting those potentially having a permeation of plating solution, and regarding those having a defect in the base-substrate as defective after dicing (without performing a burn-in test).

Nonetheless, in the defect inspection during wafer processing as described above, in the wafer, at the surface of the Al alloy film thereof, crystal grains having a particle size in a range of about 0.5 μm to 20 μm are present and thus, a problem arises in that defects larger than 0.5 μm cannot be detected, and 100% of the defects that will result in nonconforming devices in the future cannot be detected. Further, a problem arises in that in the inspection before the formation of the Al alloy film, defects occurring any time after the inspection until formation of the Al alloy film cannot be detected.

Herein, a method of manufacturing a semiconductor device according to an embodiment solving the problems described above is described. FIG. 1 is a cross-sectional view depicting a structure of the semiconductor device according to the embodiment. The structure of the semiconductor device according to the embodiment is described taking a trench-type IGBT 150 as an example.

The IGBT 150 has an active region that is a region through which current flows during an on-state and an edge termination region that surrounds a periphery of the active region, however, in FIG. 1, only the active region is depicted. The IGBT 150 has an $n^-$-type semiconductor substrate 18 constituting an $n^-$-type drift layer and in the $n^-$-type semiconductor substrate 18, at a front surface thereof, an n-type accumulation layer 16 may be provided. The n-type accumulation layer 16 is a so-called current spreading layer (CSL) that reduces carrier spreading resistance. On the n-type accumulation layer 16 (at the front side of the $n^-$-type semiconductor substrate 18), a p-type base region 14 is provided. Gate trenches 40 that penetrate through the p-type base region 14 and reach the $n^-$-type semiconductor substrate 18 are provided. On both sides of each of the gate trenches 40, $n^+$-type emitter regions 12 are provided and the gate trenches 40 are disposed at predetermined intervals, for example, in a striped layout in a plan view, separating the p-type base region 14 into multiple regions (mesa portions). In the gate trenches 40, along inner walls of the gate trenches 40, gate insulating films 50 are provided and gate electrodes 51 are provided on the gate insulating films 50.

In the p-type base region 14, the $n^+$-type emitter regions 12 are selectively provided at each of the mesa portions. The $n^+$-type emitter regions 12 face the gate electrodes 51 with the gate insulating films 50 provided at the inner walls of the gate trenches 40 intervening therebetween. An emitter electrode 52 is in contact with the $n^+$-type emitter regions 12 via contact holes 39 provided in an interlayer insulating film 38 and is electrically insulated from the gate electrodes 51 by the interlayer insulating film 38. In the $n^+$-type emitter regions 12, openings may be selectively provided and the emitter electrode 52 and the p-type base region 14 may be electrically connected with each other in the openings. Further, contact plugs 26 may be embedded in the contact holes 39 and the emitter electrode 52 may be connected to the $n^+$-type emitter regions 12 via the contact plugs 26 through a barrier metal (not depicted). The emitter electrode 52 is configured by an Al film or an AlSi film; the contact plugs 26 are configured by tungsten (W); and the barrier metal may be configured by a two-layer film containing one layer of titanium (Ti) and one layer of titanium nitride (TiN).

In the $n^-$-type semiconductor substrate 18, at the back surface thereof, an $n^+$-type field stop (FS) layer 20 is provided. The $n^+$-type FS layer 20 has a function of suppressing the spreading of a depletion layer that spreads in a direction from a pn junction between the p-type base region 14 and the $n^-$-type semiconductor substrate 18 to a later-described $p^+$-type collector region 22 during an off-state.

In the $n^-$-type semiconductor substrate 18, at a position closer to the back surface thereof than is the $n^+$-type FS layer 20, the $p^+$-type collector region 22 is provided. A back electrode 24 is provided at the surface (in an entire area of the back surface of the $n^-$-type semiconductor substrate 18) of the $p^+$-type collector region 22. The back electrode 24 functions as a collector electrode.

Figure 2:
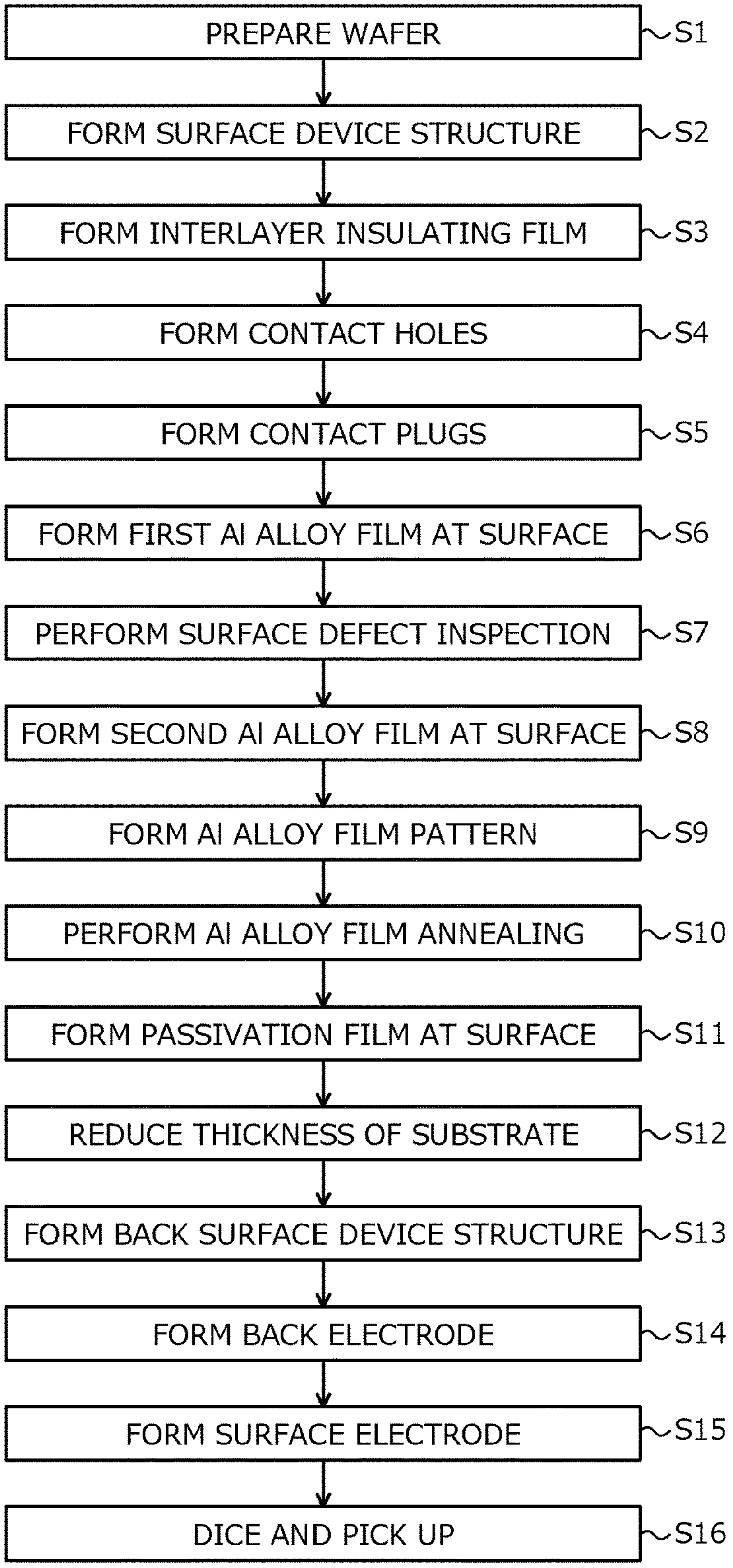
FIG. 2 is a flowchart of a method of manufacturing the semiconductor device according to the embodiment.
Figure 3:
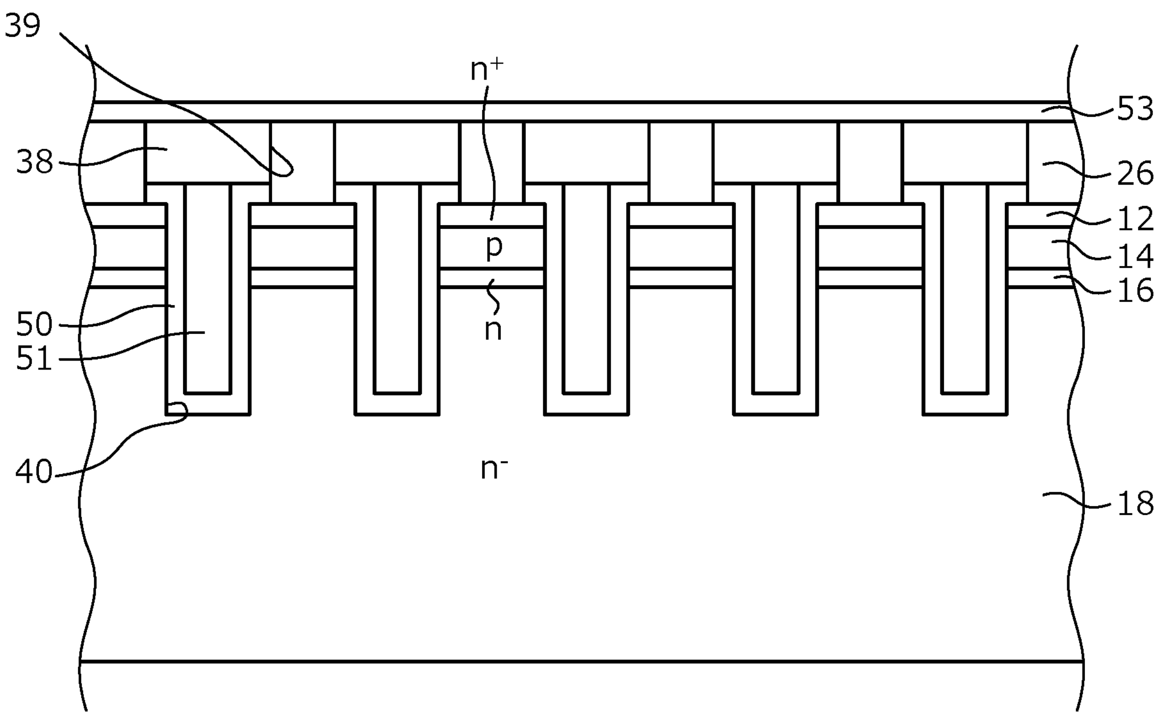
FIG. 3 is a cross-sectional view depicting a state of the semiconductor device according to the embodiment during manufacture.
Figure 4:
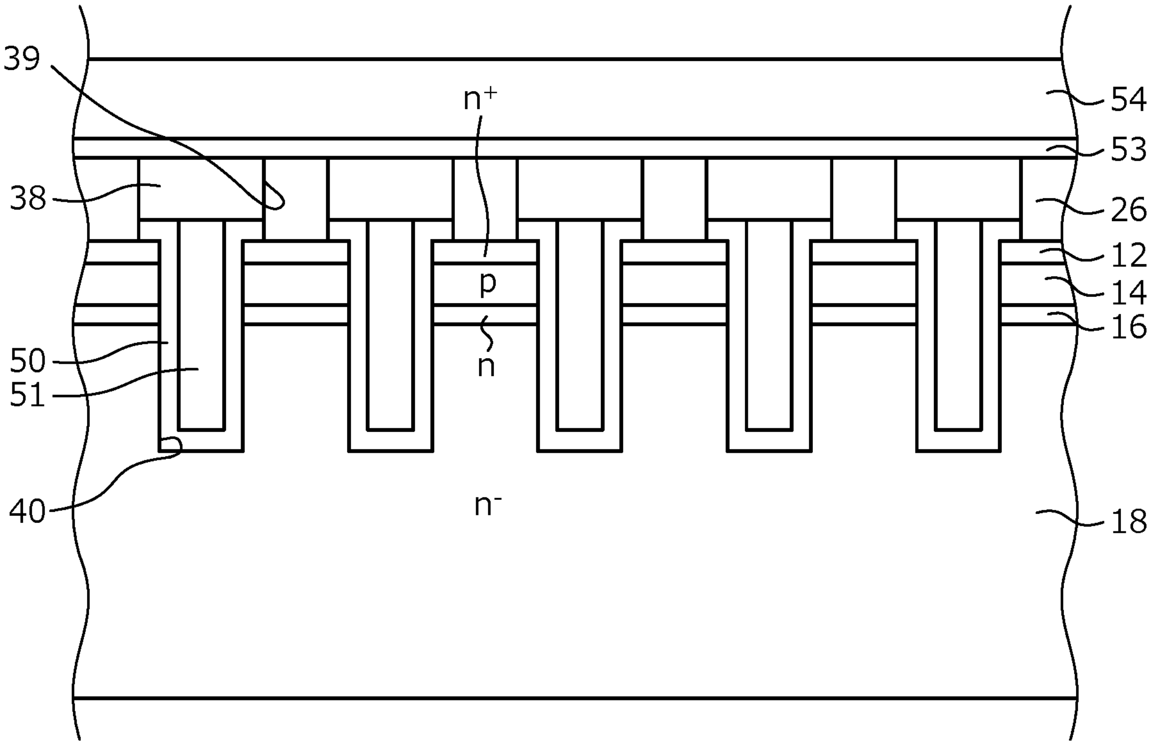
FIG. 4 is a cross-sectional view depicting a state of the semiconductor device according to the embodiment during manufacture.

Next, a method of manufacturing the semiconductor device according to the embodiment is described. FIG. 2 is a flowchart of the method of manufacturing the semiconductor device according to the embodiment. FIGS. 3 and 4 are cross-sectional views depicting states of the semiconductor device according to the embodiment during manufacture.

First, the $n^-$-type semiconductor substrate 18 (wafer) having a normally employed thickness is prepared (step S1). Next, in the $n^-$-type semiconductor substrate 18, at the front surface thereof, a surface device structure is formed by a general method, the $n^-$-type semiconductor substrate 18 constituting an n-type drift layer (step S2: first process). For example, the surface device structure is formed as follows. In the $n^-$-type semiconductor substrate 18, the gate trenches 40, the gate insulating films 50, and the gate electrodes 51 are sequentially formed, thereby, forming the MOS gates. In the $n^-$-type semiconductor substrate 18, at a depth closer to the front surface thereof than are bottoms of the gate trenches 40, for example, the n-type accumulation layer 16 may be formed by ion implantation of an n-type impurity.

Next, in the $n^-$-type semiconductor substrate 18, at a depth closer to the front surface of the $n^-$-type semiconductor substrate 18 than are the bottoms of the gate trenches 40, the p-type base region 14 is formed by ion implantation of a p-type impurity such as boron (B). Alternatively, in an instance of the n-type accumulation layer 16, the p-type base region 14 is formed at a depth closer to the front surface of the $n^-$-type semiconductor substrate 18 than is the n-type accumulation layer 16. Next, in the p-type base region 14, at the front surface thereof, the $n^+$-type emitter regions 12 are selectively formed by ion implantation of an n-type impurity such as phosphorus (P), arsenic (As), or the like.

Next, the interlayer insulating film 38, such as, for example, a BPSG film is deposited (formed) so as to cover the gate electrodes 51 (step S3: second process). Next, the interlayer insulating film 38 is patterned, thereby forming the contact holes 39 and thus, exposing the $n^+$-type emitter regions 12 (step S4: third process). Next, in the contact holes 39, the contact plugs 26 may be formed via a barrier metal (not depicted) (step S5).

Next, for example, by a sputtering method, a first Al alloy film 53 that covers an entire area of the surface of the interlayer insulating film 38 is formed so as to be in contact with the $n^+$-type emitter regions 12 or the contact plugs 26 in the contact holes 39 (step S6: fourth process). The state up to here is depicted in FIG. 3. The first Al alloy film 53, for example, is an Al film or an Al alloy film containing Si, copper (Cu), etc. such as an AlSi film, an AlSiCu film, or the like. At step S6, the first Al alloy film 53 is formed having a thickness in a range of 0.05 μm to 0.5 μm. The film formation temperature may be preferably not more than 100 degrees C. but not less than room temperature (RT). As compared to deposition of a conventional thickness of 5 μm, the film is deposited thinly by low-temperature deposition, whereby the growth of crystal grain boundaries (grains) may be suppressed and the size of the crystal grain boundaries of the first Al alloy film 53 is smaller than conventionally and is not more than 0.2 μm. Thus, the resolution of an optical microscope is insufficient for observation of the crystal grains.

Next, the surface defect inspection is performed (step S7: fifth process). As a result, defects occurring during the processes from the formation of the interlayer insulating film 38 to the formation of the first Al alloy film 53 are inspected. The surface defect inspection may be performed by an automated visual inspection system using an optical microscope. Defects at this stage have the potential of becoming killer defects during the formation of a second Al alloy film 54 during the next process and therefore, a highly sensitive microdefect detection inspection is performed with a dark field. In the embodiment, the surface of the first Al alloy film 53 is inspected for defects under the plating, in a state in which the size of the crystal grain boundaries is as small as 0.2 μm or less. Thus, when the defect inspection is performed at this point in time, light from only defects may be detected without receiving scattering from crystal grain boundaries in the dark field. Here, when a defect is detected, the coordinates thereof at the wafer surface of the detected chip are stored.

Here, the dark field is a method in which a sample is irradiated with light horizontally or from an angle and observation is made by only the scattered or reflected light from the sample, depressions and hollow portions appear bright. On the other hand, a bright-field is a method of observing transmitted light, depressions and dimples appear dark. In the embodiment, to detect defects that are depressions or dimples at the surface of the first Al alloy film 53, the defect inspection is performed with the dark field.

Figure 5:
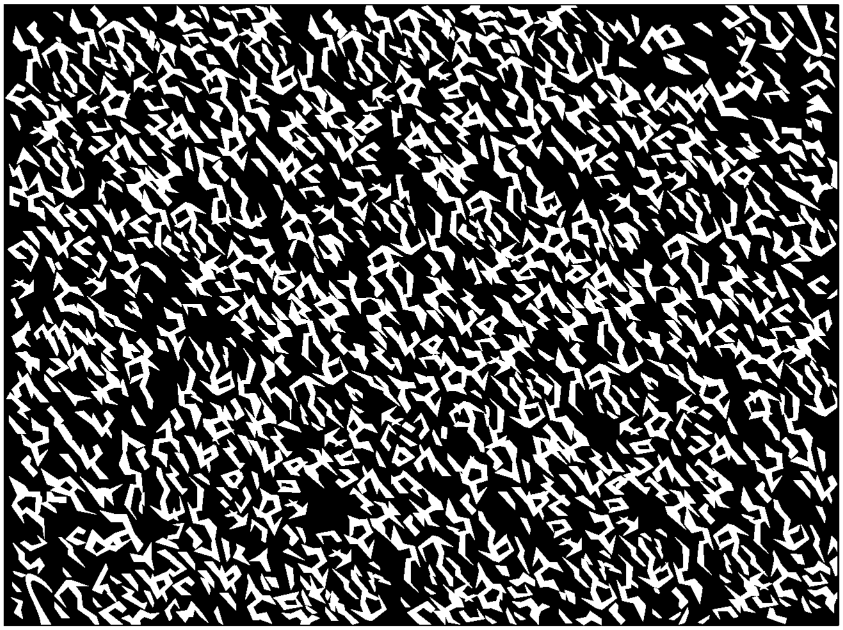
FIG. 5 is a schematic of a micrograph of a surface of an AlSi film of an emitter electrode of a conventional semiconductor device.
Figure 6:
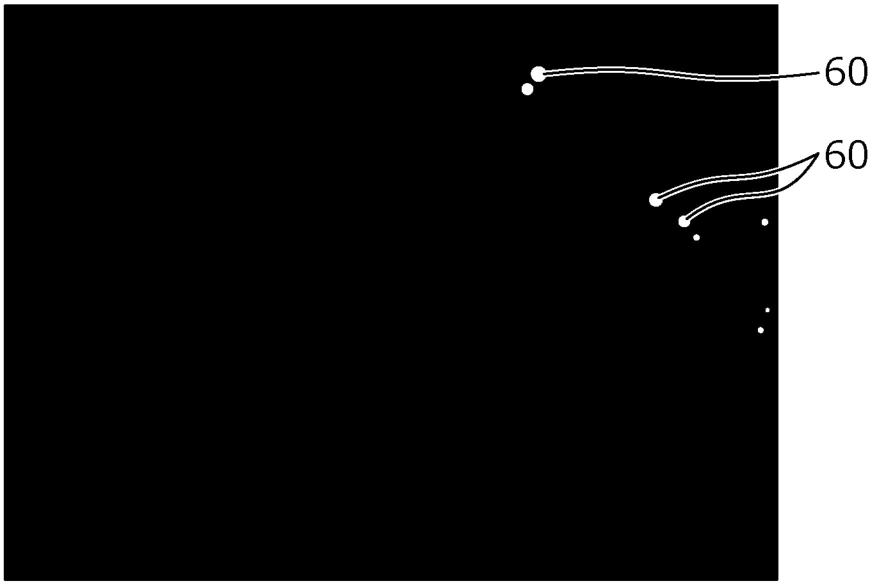
FIG. 6 is a schematic of a micrograph of the AlSi of the emitter electrode of the semiconductor device according to the embodiment.

FIG. 5 is a schematic of a micrograph of a surface of an AlSi film of an emitter electrode of a conventional semiconductor device. FIG. 6 is a schematic of a micrograph of the AlSi of the emitter electrode of the semiconductor device according to the embodiment. As depicted in FIG. 5, at the surface of the conventional AlSi film, the particle size of the crystal grains is large in a range of about 0.5 μm to 20 μm and thus, since the crystal grains are captured in the micrograph, it is difficult to distinguish defects of a size of about 0.5 μm from crystal grains, and defects larger than 0.5 μm cannot be detected. On the other hand, as depicted in FIG. 6, in the AlSi film of the semiconductor device according to the embodiment, the crystal grain boundaries are as small as about 0.2 μm or less and thus, the crystal grain boundaries are not captured in the micrograph, whereby defects 60 larger than 0.5 μm may be detected.

During wafer processing, defects having a potential of causing Vth anomalies (I-V curve anomalies) are greater than 0.5 μm in height and greater than 0.5 μm in the lateral direction. Conventionally, defects greater than 0.5 μm in height could not be detected, however, by the method of the embodiment, without scattering from small crystal grain boundaries of 0.2 μm or less, inspection of defects of sizes greater than 0.5 μm is possible and defects of a height greater than 0.5 μm may be detected with high probability.

As described, in the embodiment, inspection is performed after the formation of the first Al alloy film 53, which is thin. Therefore, in the defect inspection during the wafer processing, defects in the wafer processing up to the time of formation of the Al alloy film may be detected in addition to those of the processes from the formation of the interlayer insulating film 38 to the formation of the contact plugs 26, and the grain boundary of the first Al alloy film 53 is as small as 0.2 μm or less, whereby defects of a size greater than 0.5 μm may be detected. As described, large defects may be detected and thus, the burn-in test becomes unnecessary and man-hours may be reduced.

Next, for example, the second Al alloy film 54 that covers an entire area of the surface of the first Al alloy film 53 is formed by a sputtering method (step S8: sixth process). The state up to here is depicted in FIG. 4. The second Al alloy film 54 is an Al film, an alloy film containing Si, Cu, or the like with Al such as, for example, an AlSi film, an AlSiCu film, etc. At step S8, by a film formation temperature in a range of 250 degrees C. to 400 degrees C., the second Al alloy film 54 is formed to have a thickness such that a combined thickness of the first Al alloy film 53 and the second Al alloy film 54 is 5.0 μm±10% (4.5 μm to 5.5 μm). Here, thick film deposition by high-temperature deposition causes the crystal grain boundaries to grow and the size of the crystal grain boundaries is about the same as that conventionally. As a result, a surface electrode of a thickness of about 5.0 μm may be formed, whereby a surface electrode of a film quality substantially the same as that conventionally is formed. Here, the film quality refers to film thickness, crystal grain diameter, crystal orientation, film stress, etc. Further, before the formation of the second Al alloy film 54, contaminants (adhered organic matter, natural oxide surface film, etc.) of the surface of the first Al alloy film 53 may be removed by reverse sputtering of argon ions ($Ar^+$), etc. and the surface may be cleaned.

Next, the Al alloy film configured by the first Al alloy film 53 and the second Al alloy film 54 is patterned (step S9: seventh process). Next, the Al alloy film is annealed and the emitter electrode 52 is formed (step S10: eighth process).

Next, on the emitter electrode 52, the passivation film (not depicted) is formed by, for example, a polyimide film (step S11). Next, the $n^-$-type semiconductor substrate 18 is grinded from the back surface thereof, to a position corresponding to the product thickness used for the semiconductor device (step S12). Next, at the grinded surface of the $n^-$-type semiconductor substrate 18, a back surface device structure is formed (step S13). For example, in the $n^-$-type semiconductor substrate 18, in an entire area of the back surface thereof, a p-type impurity such as boron (B) is ion-implanted and in the entire area of the back surface of the $n^-$-type semiconductor substrate 18, the $p^+$-type collector region 22 is formed. Further, in the entire area of the back surface of the $n^-$-type semiconductor substrate 18, for example, an n-type impurity such as phosphorus is ion-implanted and in the $n^-$-type semiconductor substrate 18, the $n^+$-type FS layer 20 is formed.

Next, the $p^+$-type collector region 22 and the $n^+$-type FS layer 20 are activated by a heat treatment (annealing). Next, in the entire area of the back surface of the semiconductor substrate, the back electrode 24 in contact with the $p^+$-type collector region 22 is formed (step S14). Next, the passivation film is patterned, the emitter electrode 52 and each electrode pad are exposed, the Ni—P plating is formed on the emitter electrode 52, and the Au plating is formed thereon, whereby a surface electrode is formed (step S15). Next, the $n^-$-type semiconductor substrate 18 is cut (diced) into individual chips, and chips free of defects detected at step S7 are picked up (step S16: ninth process). As described, when chips are picked up, remaining chips are regarded to be defective, whereby defective chips may be prevented from entering the market. Thus, the IGBT 150 depicted in FIG. 1 is completed.

As described above, according to the embodiment, the first Al alloy film is formed having a thickness in a range of 0.05 μm to 0.5 μm and thereafter, the thick second Al alloy film is formed, thereby forming emitter electrode and after the formation of the thin first Al alloy film, the defect inspection is performed with a dark field. The first Al alloy film has crystal grain boundaries of a small size and thus, defects having the potential to cause Vth anomalies greater than 0.5 μm may be detected. As described, defects larger than 0.5 μm may be detected by the defect inspection during wafer processing, whereby the burn-in test becomes unnecessary and man-hours may be reduced. Further, processes after dicing, up to the semi-finished products and materials for the semi-finished products are not wasted.

In the foregoing, while an instance in which a MOS gate structure is configured on a first main surface of a silicon substrate has been described as an example, the present invention is not limited hereto and various modifications such as the type (for example, silicon carbide (SiC)) of semiconductor, surface orientation of the substrate main surface, etc. are possible. Further, in the embodiment, while a trench-type IGBT is described as an example, the present invention is not limited hereto and is applicable to semiconductor devices of various configurations such as MOS-type semiconductor devices like metal oxide semiconductor field effect transistors (MOSFETs), and planar IGBTs. Further, in the embodiment, while a first conductivity type is assumed to be an n-type and a second conductivity type is assumed to be a p-type, the present invention is similarly implemented when the first conductivity type is a p-type and the second conductivity type is an n-type.

The method of manufacturing a semiconductor device according to the present invention achieves an effect in that by wafer processing, defects having the potential of causing Vth anomalies (I-V curve anomalies) may be detected.

As described, the method of manufacturing a semiconductor device according to the present invention is useful for high-voltage semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:

providing a semiconductor substrate;

forming a surface structure including a metal oxide semiconductor (MOS) structure in the semiconductor substrate;

forming an interlayer insulating film covering the surface structure;

forming, in the interlayer insulating film, a contact hole to expose the surface structure;

forming a first Al alloy film in contact with the surface structure and covering an entire surface of the interlayer insulating film, the first Al alloy film having a thickness in a range of 0.05 μm to 0.5 μm;

detecting, using a dark field, a defect of a surface of the first Al alloy film;

forming a second Al alloy film covering the entire surface of the first Al alloy film;

patterning the first Al alloy film and the second Al alloy film;

annealing the first Al alloy film and the second Al alloy film; and dicing the semiconductor substrate into a plurality of chips, and picking, among the plurality of chips, chips free of the detected defect.

2. The method of manufacturing according to claim 1, wherein forming the first Al alloy film includes forming the first Al alloy film by a temperature of not more than 100 degrees C.

3. The method of manufacturing according to claim 1, wherein forming the first Al alloy film includes forming the first Al alloy film in which a size of crystal grain boundaries of Al is not more than 0.2 μm.

4. The method of manufacturing according to claim 1, wherein the first Al alloy film is an Al film, an AlSi film, or an AlSiCu film.

5. The method of manufacturing according to claim 1, wherein a combined thickness of the first Al alloy film and the second Al alloy film is in a range of 4.5 μm to 5.5 μm.

* * * * *